(12) United States Patent
Takagi et al.

(10) Patent No.: US 9,419,051 B2
(45) Date of Patent: Aug. 16, 2016

(54) SOLID-STATE IMAGING DEVICE

(75) Inventors: Shin-ichiro Takagi, Hamamatsu (JP);
Yasuhito Yoneta, Hamamatsu (JP);
Hisanori Suzuki, Hamamatsu (JP);
Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/977,987

(22) PCT Filed: Oct. 31, 2011

(86) PCT No.: PCT/JP2011/075098
§ 371 (c)(1),
(2), (4) Date: Jul. 2, 2013

(87) PCT Pub. No.: WO2012/098747
PCT Pub. Date: Jul. 26, 2012

(65) Prior Publication Data
US 2013/0270609 A1 Oct. 17, 2013

(30) Foreign Application Priority Data
Jan. 20, 2011 (JP) .................................. 2011-010114

(51) Int. Cl.
*H04N 3/14* (2006.01)
*H04N 5/335* (2011.01)
(Continued)

(52) U.S. Cl.
CPC .... *H01L 27/14806* (2013.01); *H01L 27/14612* (2013.01); *H04N 5/355* (2013.01); *H04N 5/3725* (2013.01); *H04N 5/37213* (2013.01)

(58) Field of Classification Search
CPC . H04N 5/355; H04N 5/3725; H04N 5/37213; H01L 27/14612; H01L 27/14806; H01L 27/148

USPC ......... 348/294–324; 250/208.1; 257/290–292
See application file for complete search history.

(56) References Cited

U.S. PATENT DOCUMENTS

| 4,168,444 A | 9/1979 | van Santen |
| 5,365,093 A | 11/1994 | Kuno |

(Continued)

FOREIGN PATENT DOCUMENTS

| CN | 1191386 A | 8/1998 |
| CN | 101542734 | 9/2009 |

(Continued)

OTHER PUBLICATIONS

English-language translation of International Preliminary Report on Patentability (IPRP) dated Jul. 25, 2013 that issued in WO Patent Application No. PCT/JP2011/076091.

(Continued)

*Primary Examiner* — Yogesh Aggarwal
(74) *Attorney, Agent, or Firm* — Drinker Biddle & Reath LLP (57) ABSTRACT

A solid-state imaging device is provided with a plurality of photoelectric converting portions each having a photosensitive region and an electric potential gradient forming region, and which are juxtaposed so as to be along a direction intersecting with a predetermined direction, a plurality of buffer gate portions each arranged corresponding to a photoelectric converting portion and on the side of the other short side forming a planar shape of the photosensitive region, and accumulates a charge generated in the photosensitive region of the corresponding photoelectric converting portion, and a shift register which acquires charges respectively transferred from the plurality of buffer gate portions, and transfers the charges in the direction intersecting with the predetermined direction, to output the charges. The buffer gate portion has at least two gate electrodes to which predetermined electric potentials are respectively applied so as to increase potential toward the predetermined direction.

2 Claims, 9 Drawing Sheets

(51) Int. Cl.
*H01L 27/148* (2006.01)
*H01L 27/146* (2006.01)
*H04N 5/355* (2011.01)
*H04N 5/372* (2011.01)
*H04N 5/3725* (2011.01)

(56) References Cited

U.S. PATENT DOCUMENTS

| | | | |
|---|---|---|---|
| 5,965,910 | A | 10/1999 | Wood |
| 7,446,358 | B2 | 11/2008 | Kanbe |
| 7,479,686 | B2 | 1/2009 | Costello et al. |
| 8,415,604 | B2 * | 4/2013 | Suzuki .............. H04N 5/3692 250/208.1 |
| 8,426,902 | B2 | 4/2013 | Masuoka et al. |
| 8,446,500 | B2 * | 5/2013 | Suzuki et al. ............... 348/294 |
| 2012/0025281 | A1 | 2/2012 | Masuoka et al. |
| 2013/0270609 | A1 | 10/2013 | Takagi et al. |
| 2013/0285188 | A1 | 10/2013 | Ikeya et al. |

FOREIGN PATENT DOCUMENTS

| | | |
|---|---|---|
| EP | 2 093 801 | 8/2009 |
| EP | 2 273 551 A1 | 1/2011 |
| JP | 60-84868 A | 5/1985 |
| JP | 4-115574 A | 4/1992 |
| JP | H4-134862 | 5/1992 |
| JP | H6-140442 | 5/1994 |
| JP | H6-236987 | 8/1994 |
| JP | H7-130989 | 5/1995 |
| JP | 2001-060681 | 3/2001 |
| JP | 2005-109313 A | 4/2005 |
| JP | 2005-223258 | 8/2005 |
| JP | 2005-268564 | 9/2005 |
| JP | 2007-259417 | 10/2007 |
| JP | 2009-272333 A | 11/2009 |
| JP | 2011-187921 | 9/2011 |
| WO | WO 2009/133799 | 11/2009 |

OTHER PUBLICATIONS

U.S. Appl. No. 13/979,172, filed Jul. 11, 2013.

* cited by examiner

SOLID-STATE IMAGING DEVICE

TECHNICAL FIELD

The present invention relates to a solid-state imaging device.

BACKGROUND ART

There is disclosed a solid-state imaging device which includes a plurality of photoelectric converting portions, each having a photosensitive region which generates a charge according to incidence of light, and which has a planar shape of a nearly rectangular shape formed by two long sides and two short sides, and an electric potential gradient forming region which forms an electric potential gradient increasing along a predetermined direction parallel to the long sides forming the planar shape of the photosensitive region with respect to the photosensitive region, the plurality of photoelectric converting portions being juxtaposed along a direction intersecting with the predetermined direction, and a plurality of charge accumulating portions, each being arranged corresponding to the photoelectric converting portion and on the side of the other short side forming the planar shape of the photosensitive region, and each accumulating a charge generated in the photosensitive region of the corresponding photoelectric converting portion (for example, refer to Patent Literature 1). The solid-state imaging device of this type has been used heretofore in various uses, and has been commonly used, particularly, as a light detecting means of a spectroscope.

CITATION LIST

Patent Literature

Patent Literature 1: Japanese Patent Application Laid-Open No. 2009-272333

SUMMARY OF INVENTION

Technical Problem

Meanwhile, in recent years, the improvement of dynamic range and a reduction in diagnostic time are required to be both satisfied for solid-state imaging devices particularly intended for medical purposes such as an SD-OCT (Spectral Domain Optical Coherence Tomography). It is possible to expand a dynamic range by increasing a saturated charge quantity in each charge accumulating portion. It is possible to reduce a diagnostic time by speeding up a line rate.

However, an increase in saturated charge quantity and speeding-up of a line rate are in a so-called "trade-off" relationship. That is, for attempting to expand a photosensitive region to increase a charge to be generated in order to increase a saturated charge quantity, it is necessary to expand an area of a charge accumulating portion in which a charge discharged from the photosensitive region is accumulated. In the case where the area of the charge accumulating portion is expanded, because the length in a direction intersecting with the predetermined direction is restricted by a pixel pitch, it is necessary to elongate the length in the predetermined direction. When the charge accumulating portion is elongated in the predetermined direction, it takes time for charge transfer in the charge accumulating portion, which results in a reduction in the line rate.

The present invention has been achieved in consideration of the above-described point, and an object of the present invention is to provide a solid-state imaging device capable of increasing a saturated charge quantity without sacrificing a line rate.

Solution to Problem

A solid-state imaging device according to the present invention includes a plurality of photoelectric converting portions, each having a photosensitive region which generates a charge according to incidence of light, and which has a planar shape of a nearly rectangular shape formed by two long sides and two short sides, and an electric potential gradient forming region which forms an electric potential gradient increasing along a predetermined direction parallel to the long sides forming the planar shape of the photosensitive region with respect to the photosensitive region, the plurality of photoelectric converting portions being juxtaposed along a direction intersecting with the predetermined direction, a plurality of charge accumulating portions, each being arranged corresponding to the photoelectric converting portion and on the side of the other short side forming the planar shape of the photosensitive region, and each accumulating a charge generated in the photosensitive region of the corresponding photoelectric converting portion, and a charge output portion which acquires charges respectively transferred from the plurality of charge accumulating portions, and transfers the charges in the direction intersecting with the predetermined direction, to output the charges, the solid-state imaging device in which the charge accumulating portion has at least two gate electrodes which are arranged along the predetermined direction, and to which predetermined electric potentials are respectively applied so as to increase potential toward the predetermined direction.

In the solid-state imaging device according to the present invention, a potential difference increasing toward the predetermined direction is generated in each charge accumulating portion. Thus the charge is dominated by the potential difference to migrate, so as to speed up a charge transfer speed in the charge accumulating portion. Therefore, even if the length in the predetermined direction of the charge accumulating portion is set to be longer in order to increase a saturated charge quantity, a charge transfer time in the charge accumulating portion is inhibited from elongating. As a result, it is possible to prevent a reduction in line rate.

A solid-state imaging device according to the present invention includes a plurality of photoelectric converting portions, each having a photosensitive region which generates a charge according to incidence of light, and which has a planar shape of a nearly rectangular shape formed by two long sides and two short sides, and an electric potential gradient forming region which forms an electric potential gradient increasing along a predetermined direction parallel to the long sides forming the planar shape of the photosensitive region with respect to the photosensitive region, the plurality of photoelectric converting portions being juxtaposed along a direction intersecting with the predetermined direction, a plurality of charge accumulating portions, each being arranged corresponding to the photoelectric converting portion and on the side of the other short side forming the planar shape of the photosensitive region, and each accumulating a charge generated in the photosensitive region of the corresponding photoelectric converting portion, and a charge output portion which acquires charges respectively transferred from the plurality of charge accumulating portions, and transfers the charges in the direction intersecting with the predetermined direction, to output the charges, the solid-state imaging device in which the charge accumulating portion has at least two gate electrodes which are arranged along the predetermined direction, and to which predetermined electric potentials increasing in the predetermined direction are respectively applied.

In the solid-state imaging device according to the present invention, because the predetermined electric potentials increasing toward the predetermined direction are respectively applied to at least the two gate electrodes of the charge accumulating portion, a potential difference increasing toward the predetermined direction is generated in each charge accumulating portion. Thus the charge is dominated by the potential difference to migrate, so as to speed up a charge transfer speed in the charge accumulating portion. Therefore, even if the length in the predetermined direction of the charge accumulating portion is set to be longer in order to increase a saturated charge quantity, a charge transfer time in the charge accumulating portion is inhibited from elongating. As a result, it is possible to prevent a reduction in line rate.

Advantageous Effects of Invention

In accordance with the present invention, it is possible to provide the solid-state imaging device capable of increasing a saturated charge quantity without sacrificing a line rate.

DESCRIPTION OF EMBODIMENTS

The preferred embodiments of the present invention will be described below in detail with reference to the accompanying drawings. In the description, the same elements or elements with the same function will be denoted by the same reference signs, omitting overlapping description.

Figure 1:
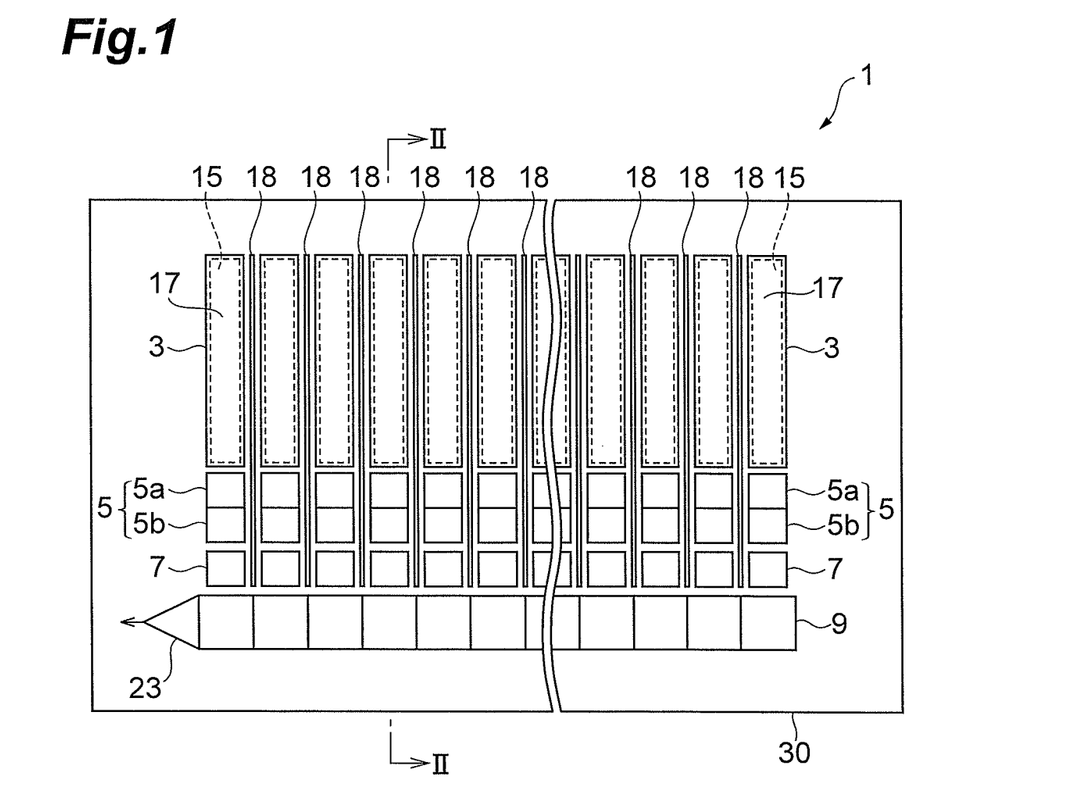
FIG. 1 is a drawing showing a configuration of a solid-state imaging device according to the present embodiment.
Figure 2:
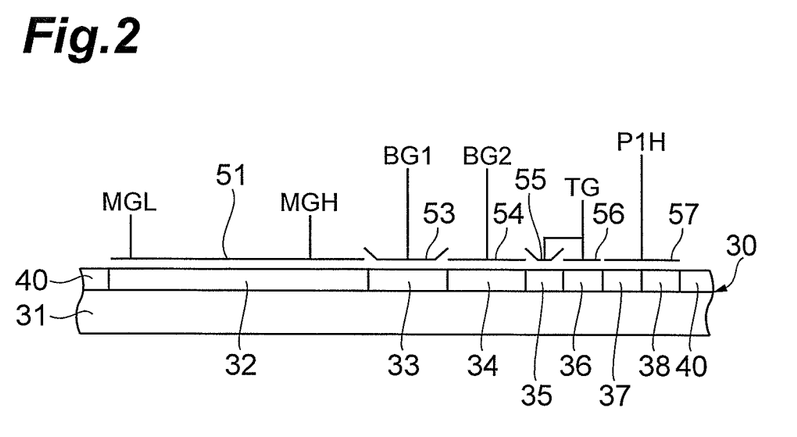
FIG. 2 is a drawing for explaining a sectional configuration along line II-II in FIG. 1.

FIG. 1 is a drawing showing a configuration of a solid-state imaging device according to the present embodiment. FIG. 2 is a drawing for explaining a sectional configuration along line II-II in FIG. 1.

The solid-state imaging device 1 according to the present embodiment is, as shown in FIG. 1, provided with a plurality of photoelectric converting portions 3, a plurality of buffer gate portions 5, a plurality of transfer portions 7, and a shift register 9 as a charge output portion.

Each photoelectric converting portion 3 has a photosensitive region 15 and an electric potential gradient forming region 17. The photosensitive region 15 senses incidence of light to generate a charge according to an intensity of incident light. The electric potential gradient forming region 17 forms an electric potential gradient increasing along a first direction (direction along the long side direction of the photosensitive region 15) directed from one short side to the other short side forming a planar shape of the photosensitive region 15, with respect to the photosensitive region 15. The electric potential gradient forming region 17 discharges a charge generated in the photosensitive region 15, from the other short side of the photosensitive region 15.

The planar shape of the photosensitive region 15 is a nearly rectangular shape formed by two long sides and two short sides. The plurality of photoelectric converting portions 3 are juxtaposed along a direction intersecting with the first direction (e.g., perpendicular thereto) and are arranged in an array form in a one-dimensional direction. The plurality of photoelectric converting portions 3 are juxtaposed in a direction along the short side direction of the photosensitive region 15. In the present embodiment, the length in the long side direction of the photosensitive region 15 is set, for example, to about 1 mm, and the length in the short side direction of the photosensitive region 15 is set, for example, to about 24 μm.

Each buffer gate portion 5 is arranged corresponding to a photoelectric converting portion 3 and on the side of the other short side forming the planar shape of the photosensitive region 15. That is, the plurality of buffer gate portions 5 are juxtaposed in the direction intersecting with the first direction (or in a direction along the short side direction of the photosensitive region 15), on the side of the other short side forming the planar shape of the photosensitive region 15. The buffer gate portion 5 is interposed between the photoelectric converting portion 3 (photosensitive region 15) and the transfer portion 7. In the present embodiment, a charge discharged from the photosensitive region 15 by the electric potential gradient forming region 17 is accumulated in the buffer gate portion 5. An isolation region 18 is arranged between adjacent buffer gate portions 5, to realize electrical isolation between the buffer gate portions 5.

Each buffer gate portion 5 in the present embodiment is composed of a first buffer gate portion 5a and a second buffer gate portion 5b. In the buffer gate portion 5, the first buffer gate portion 5a is arranged adjacent in the first direction to the photosensitive region 15, and further, the second buffer gate portion 5b is arranged adjacent in the first direction to the first buffer gate portion 5a. The length in the first direction of the buffer gate portion 5 in which the first buffer gate portion 5a and the second buffer gate portion 5b are put together is set, for example, to about 32 μm.

The first buffer gate portion 5a and the second buffer gate portion 5b are respectively composed of gate electrodes (an electrode 53 and an electrode 54 which will be described later) to which different voltages are applied, and semiconductor regions (an n-type semiconductor layer 33 and an n-type semiconductor layer 34 which will be described later) which are formed below the gate electrodes. During a charge transfer, the voltages are applied to the first buffer gate portion 5a and the second buffer gate portion 5b such that the voltage applied to the gate electrode of the first buffer gate portion 5a is lower than the voltages applied to the gate electrode of the second buffer gate portion 5b. In the present embodiment, the impurity concentrations of the semiconductor regions of the first buffer gate portion 5a and the second buffer gate portion 5b are the same. The voltage applied to the gate electrode of the first buffer gate portion 5a is applied so as to be lower by, for example, about 1V than the voltage applied to the gate electrode of the second buffer gate portion 5b. As a result, an electric potential (potential) formed below the gate electrode increases in a step-like manner at the boundary phase at which the first buffer gate portion 5a is switched to the second buffer gate portion 5b.

Each transfer portion 7 is arranged corresponding to a buffer gate portion 5 and between the buffer gate portion 5 and the shift register 9. That is, the plurality of transfer portions 7 are juxtaposed in the direction intersecting with the first direction, on the side of the other short side forming the planar shape of the photosensitive region 15. The transfer portion 7 acquires a charge accumulated in the buffer gate portion 5, and transfers the acquired charge toward the shift register 9. The isolation region 18 is arranged between adjacent transfer portions 7 to realize electrical isolation between the transfer portions 7.

The shift register 9 is arranged on the side of the other short side forming the planar shape of the photosensitive region 15. The shift register 9 receives charges respectively transferred from the transfer portions 7, and transfers the charges in the direction intersecting with the first direction, to sequentially output them to an amplifier portion 23. The charges output from the shift register 9 are converted into voltages by the amplifier portion 23, and the amplifier portion 23 outputs the voltages of the respective photoelectric converting portions 3 (photosensitive regions 15) juxtaposed in the direction intersecting with the first direction, to the outside of the solid-state imaging device 1.

The plurality of photoelectric converting portions 3, the plurality of first buffer gate portions 5a, the plurality of second buffer gate portions 5b, the plurality of transfer portions 7, and the shift register 9 are, as shown in FIG. 2, formed on a semiconductor substrate 30. The semiconductor substrate 30 includes a p-type semiconductor layer 31 as a base of the semiconductor substrate 30, n-type semiconductor layers 32, 33, 34, 36, and 38, n$^-$-type semiconductor layers 35 and 37, and a p$^+$-type semiconductor layer 40 which are formed on one side of the p-type semiconductor layer 31. In the present embodiment, Si is used as a semiconductor. The term "high impurity concentration" refers to, for example, an impurity concentration of not less than about $1 \times 10^{17}$ cm$^{-3}$ and is indicated by "+" attached to the conductivity type, and the term "low impurity concentration" refers to an impurity concentration of not more than about $1 \times 10^{15}$ cm$^{-3}$ and is indicated by "−" attached to the conductivity type. An n-type impurity is arsenic, phosphorus, or the like, and a p-type impurity is boron, or the like.

The p-type semiconductor layer 31 and the n-type semiconductor layer 32 form a pn junction, and the n-type semiconductor layer 32 constitutes the photosensitive region 15 which generates a charge with incidence of light. The n-type semiconductor layer 32 has, on a plan view, a nearly rectangular shape formed by two long sides and two short sides. The n-type semiconductor layers 32 are juxtaposed along the direction intersecting with the above-described first direction (i.e., the direction along the long side direction of the n-type semiconductor layer 32 as directed from one short side to the other short side forming the planar shape of the n-type semiconductor layer 32), and are arranged in an array form in a one-dimensional direction. The n-type semiconductor layers 32 are juxtaposed in a direction along the short side direction of the n-type semiconductor layer 32. The aforementioned isolation region may be composed of a p$^+$-type semiconductor layer.

An electrode 51 is arranged for the n-type semiconductor layer 32. The electrode 51 is made of an optically transparent material, e.g., a polysilicon film, and is formed through an insulating layer (not shown) on the n-type semiconductor layer 32. The electrode 51 constitutes the electric potential gradient forming region 17. The electrodes 51 may be formed as continuously extending in the direction intersecting with the first direction so as to stretch across the plurality of n-type semiconductor layers 32 juxtaposed along the direction intersecting with the first direction. The electrode 51 may be formed for each of the n-type semiconductor layers 32.

The electrode 51 constitutes a so-called resistive gate, and is formed so as to extend in the direction (the aforementioned first direction) directed from one short side to the other short side forming the planar shape of the n-type semiconductor layer 32. The electrode 51 is given a constant electric potential difference at its two ends, to form an electric potential gradient according to an electric resistance component in the first direction of the electrode 51, i.e., an electric potential gradient increasing along the first direction. A signal MGL is supplied to one end of the electrode 51 from a control circuit (not shown), and a signal MGH is supplied to the other end of the electrode 51 from the control circuit (not shown). When the signal MGL is L level and MGH is H level, the electric potential gradient increasing along the above-described first direction is formed in the n-type semiconductor layer 32.

An electrode 53 is arranged adjacent in the first direction to the electrode 51, and further, an electrode 54 is arranged adjacent in the first direction to the electrode 53. The electrode 53 and the electrode 54 are respectively formed through an insulating layer (not shown) on the n-type semiconductor layers 33 and 34. The n-type semiconductor layer 33 is arranged on the side of the other short side forming the planar shape of the n-type semiconductor layer 32, and the n-type semiconductor layer 34 is arranged on the side of the other short side forming the planar shape of the n-type semiconductor layer 33. The electrodes 53 and 54 are comprised of, for example, a polysilicon film. The electrodes 53 and 54 are respectively given signals BG1 and BG2 from the control circuit (not shown). The electrode 53 and the n-type semiconductor layer 33 below the electrode 53 constitute the first buffer gate portion 5a, and the electrode 54 and the n-type semiconductor layer 34 below the electrode 54 constitute the second buffer gate portion 5b.

Transfer electrodes 55 and 56 are arranged adjacent in the first direction to the electrode 54. The transfer electrodes 55 and 56 are respectively formed through an insulating layer (not shown) on the n$^-$-type semiconductor layer 35 and on the n-type semiconductor layer 36. The n$^-$-type semiconductor layer 35 and the n-type semiconductor layer 36 are arranged adjacent in the first direction to the n-type semiconductor layer 34. The transfer electrodes 55 and 56 are comprised of, for example, a polysilicon film. The transfer electrodes 55 and 56 are given a signal TG from the control circuit (not shown). The transfer electrodes 55 and 56 and the n$^-$-type semiconductor layer 35 and the n-type semiconductor layer 36 below the transfer electrodes 55 and 56 constitute the transfer portion 7.

A transfer electrode 57 is arranged adjacent in the first direction to the transfer electrode 56. The transfer electrode 57 is formed through an insulating layer (not shown) on the n$^-$-type semiconductor layer 37 and on the n-type semiconductor layer 38 respectively. The n$^-$-type semiconductor layer 37 and the n-type semiconductor layer 38 are arranged adjacent in the first direction to the n-type semiconductor layer 36. The transfer electrode 57 is comprised of, for example, a polysilicon film. The transfer electrode 57 is given a signal P1H from the control circuit (not shown). The transfer electrode 57 and the n⁻-type semiconductor layer 37 and n-type semiconductor layer 38 below the transfer electrode 57 constitute the shift register 9.

The p⁺-type semiconductor layer 40 electrically isolates the n-type semiconductor layers 32, 33, 34, 36 and 38 and the n⁻-type semiconductor layers 35 and 37 from the other portions of the semiconductor substrate 30. Each of the aforementioned insulating layers is made of an optically transparent material, e.g., a silicon oxide film. The n-type semiconductor layers 33, 34, 36 and 38 and the n⁻-type semiconductor layers 35 and 37 (the first buffer gate portion 5a, the second buffer gate portion 5b, the transfer portion 7, and the shift register 9) except for the n-type semiconductor layer 32 are preferably shielded from light, for example, by arranging a light shield member. Thereby, it is possible to prevent occurrence of unnecessary charge.

Figure 3:
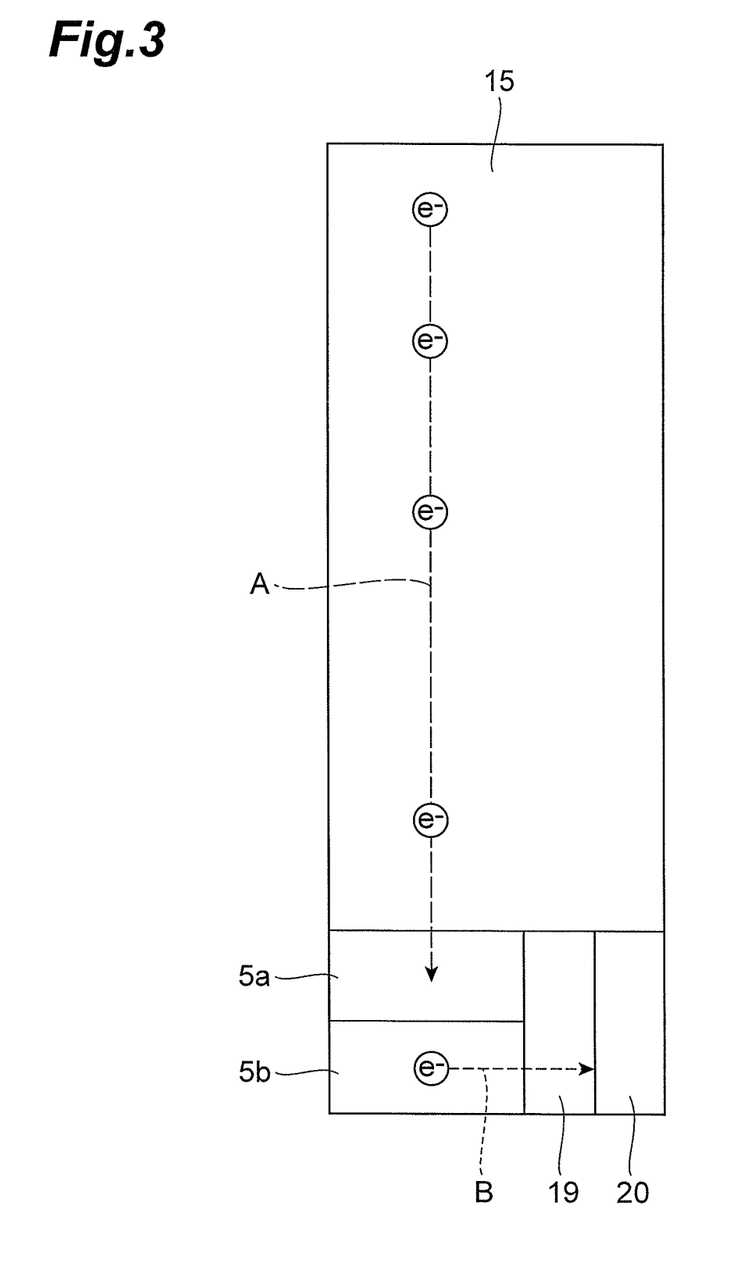
FIG. 3 is a schematic diagram showing a configuration of a buffer gate portion.

FIG. 3 shows a schematic diagram showing a configuration of the buffer gate portion 5. Each buffer gate portion 5 is arranged on the side of the other short side forming the planar shape of each photosensitive region 15. The charge generated in each photosensitive region 15 is transferred in the direction of A in FIG. 3, to be accumulated in the buffer gate portion 5. As described above, the buffer gate portion 5 is composed of the first buffer gate portion 5a and the second buffer gate portion 5b which is adjacent in the first direction of the first buffer gate portion 5a.

An overflow gate (OFG) 19 is arranged adjacent in the direction intersecting with the first direction to the buffer gate portion 5. An overflow drain (OFD) 20 composed of a gate transistor is arranged adjacent in the direction intersecting with the first direction of the overflow gate 19. With such a configuration, when a charge is generated over a storage capacitance of the buffer gate portion 5 in the buffer gate portion 5, it is possible to discharge an excess charge over the storage capacitance in the direction of B in FIG. 3. This prevents inconvenience such as blooming, a phenomenon in which a charge overflowing from the buffer gate portion 5 over the storage capacitance leaks into another buffer gate portion 5.

Figure 4:
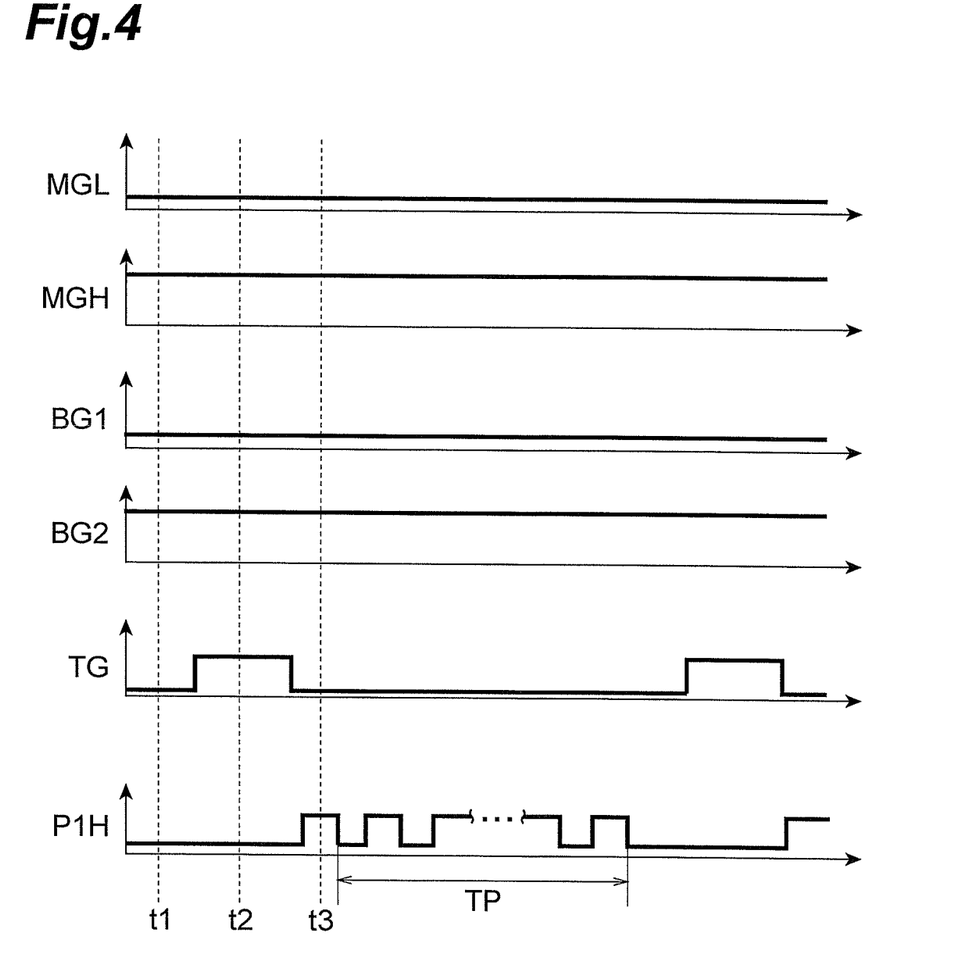
FIG. 4 is a timing chart of respective signals to be input in the solid-state imaging device according to the present embodiment.
Figure 5:
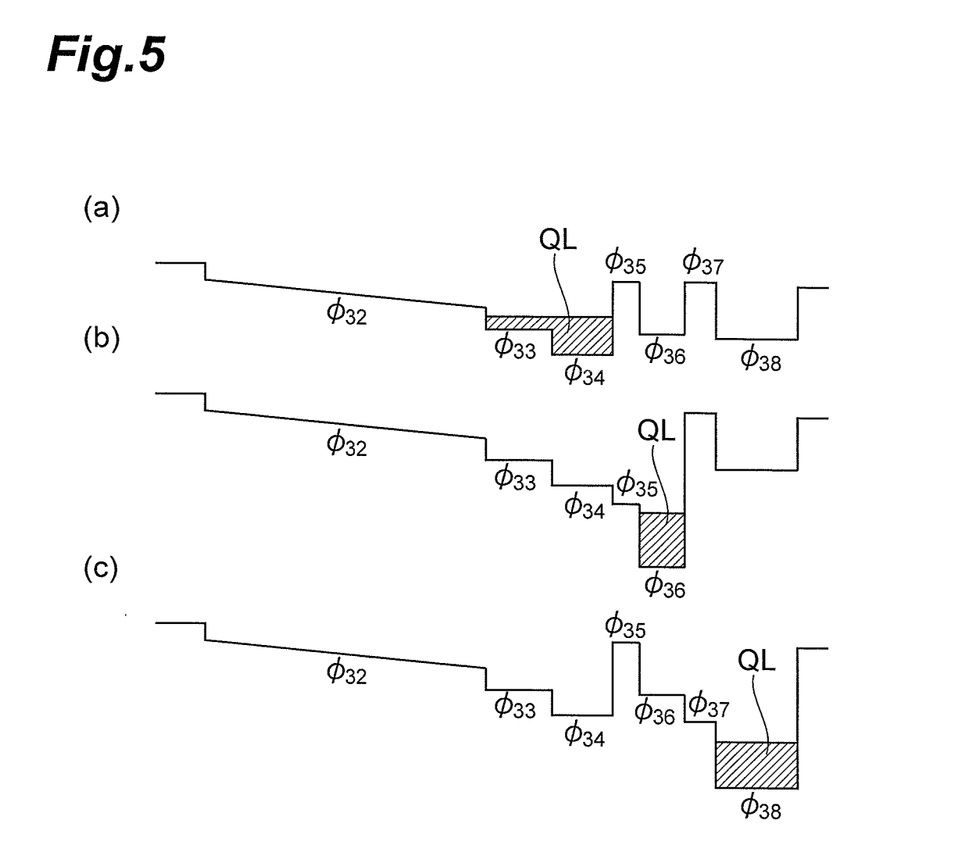
FIG. 5 are potential diagrams for explaining charge accumulation and discharge operations at respective times in FIG. 4.

Next, the operations in the solid-state imaging device 1 will be described below on the basis of FIGS. 4 and 5. FIG. 4 is a timing chart of the respective signals MGL, MGH, BG1, BG2, TG, and P1H input to the electrodes 51-60 in the solid-state imaging device 1 according to the present embodiment. FIGS. 5 (a) to (c) are potential diagrams for explaining charge accumulation and discharge operations at respective times t1 to t3 in FIG. 4.

Incidentally, positively ionized donors exist in an n-type semiconductor and negatively ionized acceptors exist in a p-type semiconductor. The potential in the n-type semiconductor becomes higher than that in the p-type semiconductor. In other words, the potential in an energy band diagram is positive in the downward direction, and therefore, the potential in the n-type semiconductor becomes deeper (or higher) than the potential in the p-type semiconductor in the energy band diagram, and has a lower energy level. When a positive electric potential is applied to each electrode, a potential of a semiconductor region immediately below the electrode becomes deeper (or increases in the positive direction). When the magnitude of the positive electric potential applied to each electrode is reduced, the potential of the semiconductor region immediately below the corresponding electrode becomes shallower (or decreases in the positive direction).

Figure 6:
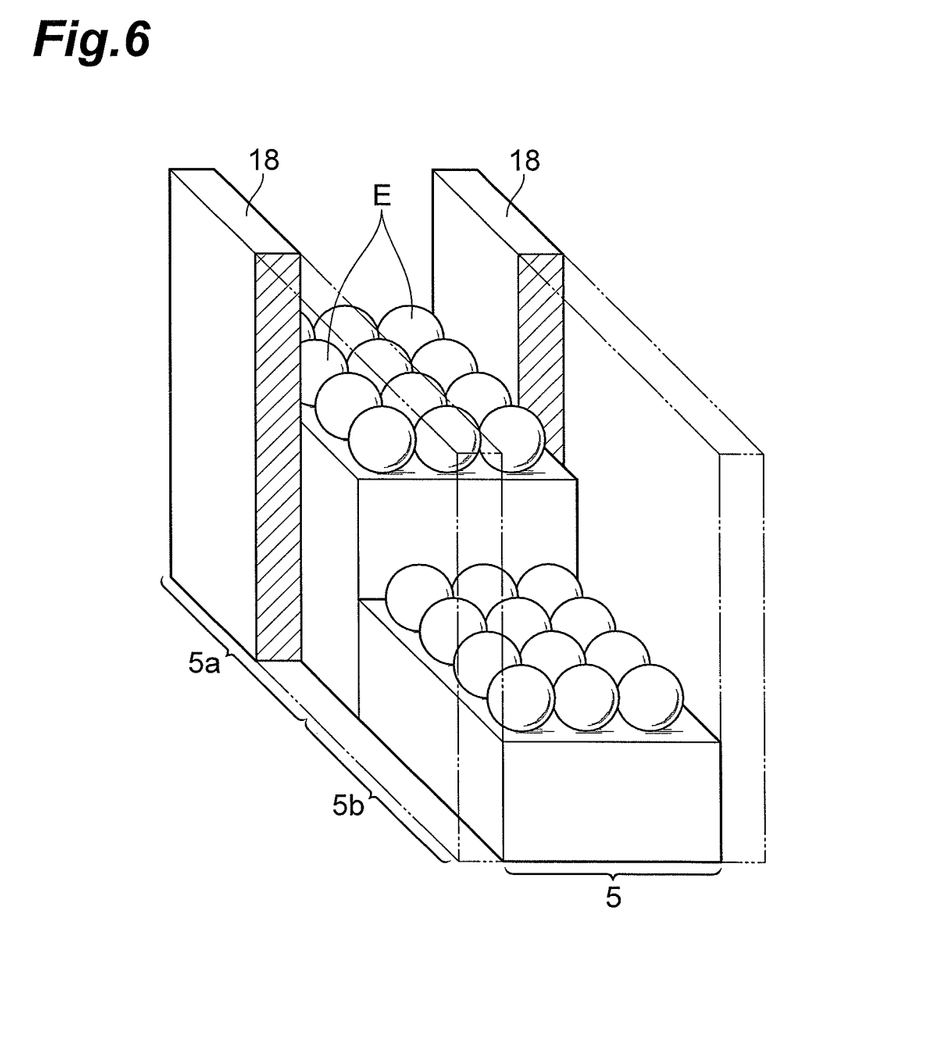
FIG. 6 is a schematic diagram for explaining charge migration in the buffer gate portion.

As shown in FIG. 4, at time t1, when the signal MGH is H level, an electric potential gradient increasing along the first direction is formed in the n-type semiconductor layer 32. The potential $\Phi_{32}$ is inclined so as to deepen toward the n-type semiconductor layer 33 side, thereby forming the gradient in the potential $\Phi_{32}$ (refer to FIG. 5 (a)). When the signals MGL, BG1, TG, and P1H are L level, and the signals MGH and BG2 are H level, the potential $\Phi_{33}$ of the n-type semiconductor layer 33 and the potential $\Phi_{34}$ of the n-type semiconductor layer 34 are deeper than the potential $\Phi_{35}$ of the n⁻-type semiconductor layer 35, thus forming wells of the potentials $\Phi_{33}$ and $\Phi_{34}$ (refer to FIG. 5 (a)). In this state, when light is incident to the n-type semiconductor layer 32 to generate a charge, the generated charge is accumulated in the wells of the potentials $\Phi_{33}$ and $\Phi_{34}$. A charge quantity QL is accumulated in the potentials $\Phi_{33}$ and $\Phi_{34}$. The potentials $\Phi_{33}$ and $\Phi_{34}$ are given BG1 and BG2, as also shown in FIG. 6 as well, such that the potential $\Phi_{34}$ becomes deeper than the potential $\Phi_{33}$.

At time t2, when the signal TG is H level, the respective potentials $\Phi_{35}$ and $\Phi_{36}$ of the n⁻-type semiconductor layer 35 and the n-type semiconductor layer 36 deepen to form a well of the potential $\Phi_{36}$. The charges accumulated in the wells of the potentials $\Phi_{33}$ and $\Phi_{34}$ are transferred into the well of the potential $\Phi_{36}$. The charge quantity QL is accumulated in the potential $\Phi_{36}$.

At time t3, when the signal TG is L level, the potentials $\Phi_{35}$ and $\Phi_{36}$ become shallow, thereby forming wells of the potentials $\Phi_{33}$ and $\Phi_{34}$. At time t3, when the signal P1H is H level, the respective potentials $\Phi_{37}$ and $\Phi_{38}$ of the n⁻-type semiconductor layer 37 and the n-type semiconductor layer 38 deepen to form wells of the potentials $\Phi_{37}$ and $\Phi_{38}$. The charge accumulated in the well of the potential $\Phi_{36}$ is transferred into the well of the potential $\Phi_{38}$. The charge quantity QL is accumulated in the potential $\Phi_{38}$.

After this, the charge in the charge quantity QL is sequentially transferred in the direction intersecting with the first direction during a charge transfer period TP, to be output to the amplifier portion 23. Although omitted from the illustration in FIG. 3, a signal for transferring the charge quantity QL in the direction intersecting with the first direction is given as the signal P1H during the charge transfer period TP.

In the present embodiment, as described above, since the predetermined electric potentials increasing toward the charge transfer direction (the above-described first direction) are respectively applied to the electrode 53 and the electrode 54 of the buffer gate portion 5, the potential formed below the electrode 53 and the electrode 54 form a difference increasing in a step-like manner toward the charge transfer direction (the above-described first direction). Thus the charge is dominated by the potential difference to migrate, so as to speed up a charge transfer speed in the buffer gate portion 5. Therefore, even if the length in the above-described first direction of the buffer gate portion 5 is set to be longer in order to increase a saturated charge quantity, a charge transfer time in the buffer gate portion 5 is inhibited from elongating. As a result, it is possible to prevent a reduction in line rate.

Next, the verification result of speeding up the charge readout speed in the buffer gate portion 5 will be described on the basis of FIGS. 7 and 8. Here, the length in the charge transfer direction (the above-described first direction) of the buffer gate portion 5 is set to 32 μm.

Figure 7:
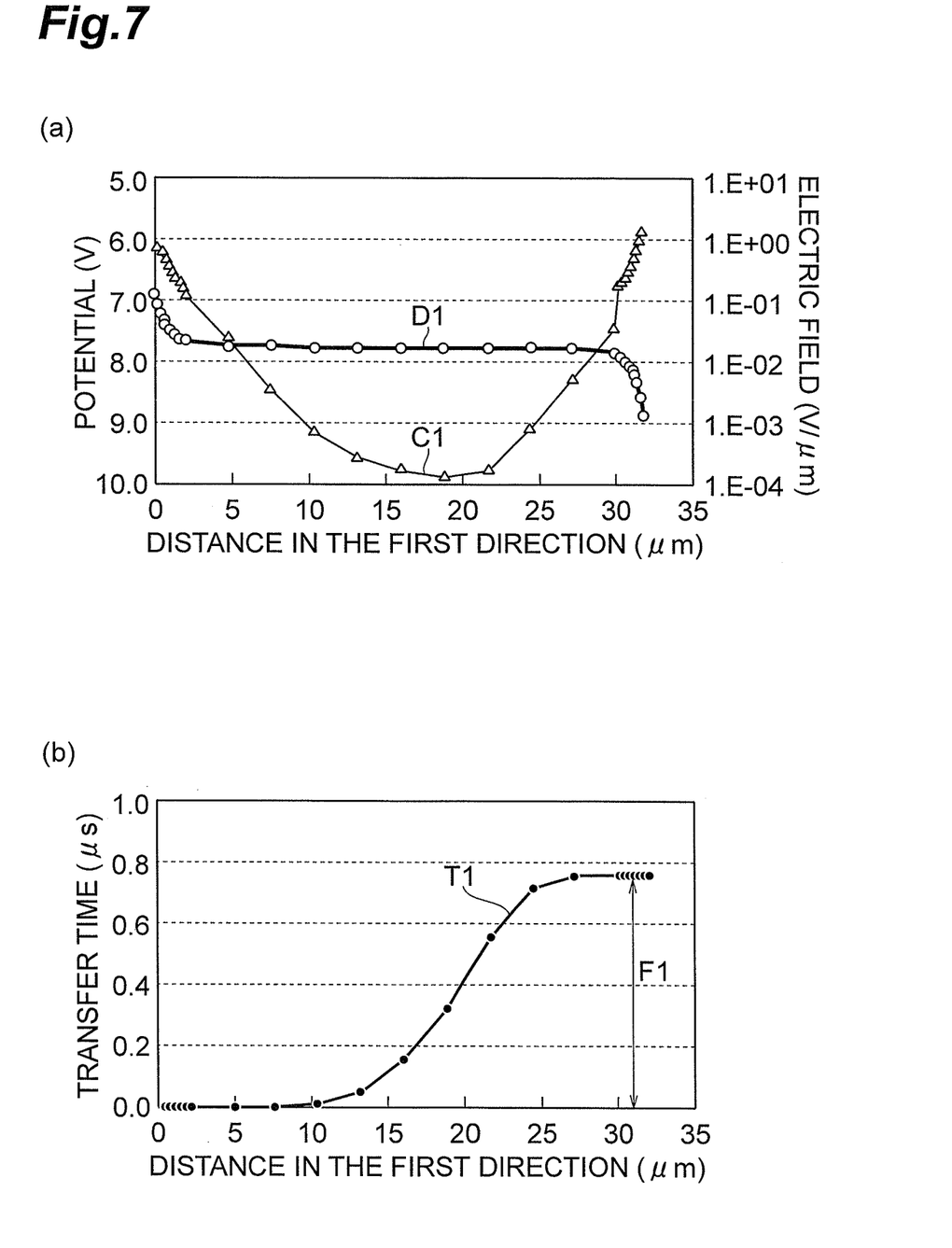
FIG. 7 are graphs showing the simulation results of electric characteristics of the solid-state imaging device in the case where no electric potential difference is provided in the buffer gate portion.

FIG. 7 are graphs showing the simulation results of electric characteristics of the solid-state imaging device 1 in the case where no electric potential difference is provided in the buffer gate portion 5, that is, the buffer gate portion 5 is composed of one electrode. In FIG. 7 (a), the horizontal axis is for distances in the first direction from the end surface on the photoelectric converting portion side of the buffer gate portion 5, and the left vertical axis is for electric potentials (potentials), and the right vertical axis is for electric fields. FIG. 7 (a) shows changes in electric field C1 and electric potential D1 along the first direction. In FIG. 7 (b), the horizontal axis is distances in the first direction from the end surface on the photoelectric converting portion side of the buffer gate portion 5, and the vertical axis is for transfer times. FIG. 7 (b) shows charge transfer times T1 in the first direction in the buffer gate portion 5. A time spent for transferring a charge in the buffer gate portion 5 is a transition time F1.

As shown in FIG. 7(a), the electric field C1 in the first direction in the case where the buffer gate portion 5 is composed of one electrode (in the case where no electric potential difference is provided) becomes the weakest in the central part of the buffer gate portion 5. The reason is as follows. In the vicinity of the photoelectric converting portion 3 and the transfer portion 7 which are adjacent to the buffer gate portion 5 (hereinafter, the adjacent sections), the buffer gate portion 5 receives fringing electric fields from the electrodes of the adjacent sections, to be able to sufficiently obtain the electric field C1 in the first direction. In contrast, in the central part most distant from the electrodes of the adjacent sections, the fringing electric fields weaken. Further, the electric potential D1 rapidly changes in the vicinity of the electrodes of the adjacent sections. In contrast, changes in the electric potential D1 are hardly seen at all in the central part of the buffer gate portion 5. That is, a potential difference is not generated. The transition time F1 in this case is about 0.8 μs as shown in FIG. 7(b).

Figure 8:
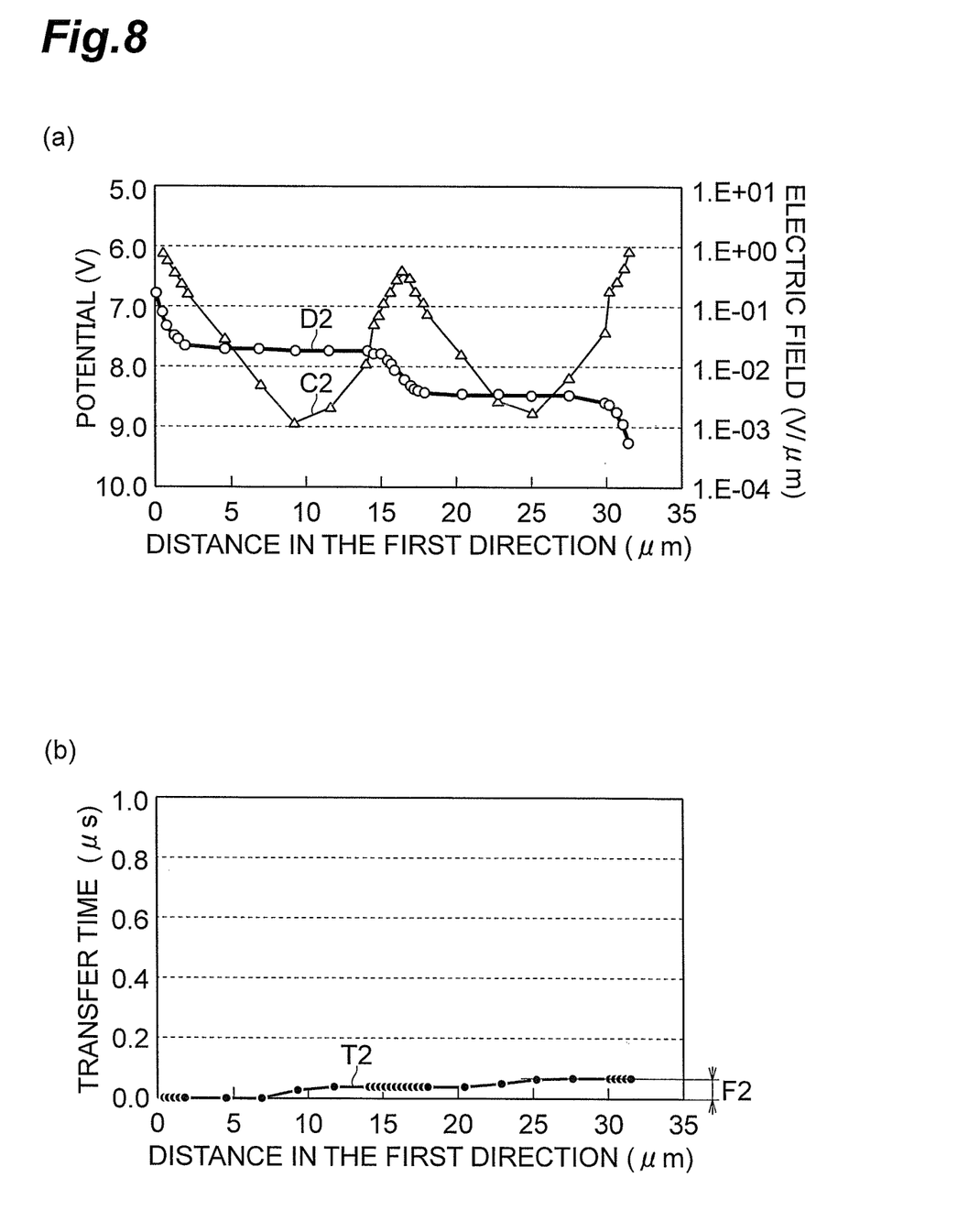
FIG. 8 are graphs showing the simulation results of electric characteristics of the solid-state imaging device in the case where an electric potential difference is provided in the buffer gate portion.

On the other hand, FIG. 8 are graphs showing the simulation results of electric characteristics of the solid-state imaging device 1 in the case where an electric potential difference is provided in the buffer gate portion 5. In the same way as FIG. 7, FIG. 8 (a) shows changes in electric field C2 and electric potential D2 along the first direction. FIG. 8 (b) shows charge transfer times T2 in the first direction in the buffer gate portion 5, and shows a transition time F2 which is a time spent for transferring a charge in the buffer gate portion 5.

As shown in FIG. 8(a), in the case where the buffer gate portion 5 is composed of two electrodes, an electric potential difference is provided such that the electric potential D2 deepens in a step-like manner in the central part of the buffer gate portion 5. The transition time F2 in this case is about 0.025 μs as shown in FIG. 8(b), and is shortened about 1/40 as compared with the transition time F1.

In the present embodiment, the charge accumulated in the buffer gate portion 5 is acquired by the transfer portion 7, to be transferred in the first direction. Then the charges transferred from the respective transfer portions 7 are transferred in the direction intersecting with the first direction by the shift register 9, to be output. The charges transferred from the plurality of photoelectric converting portions 3 are acquired by the shift register 9, to be transferred in the direction intersecting with the first direction. Accordingly, the solid-state imaging device 1 does not have to execute further signal processing for obtaining a one-dimensional image. As a result, image processing can be prevented from becoming complicated.

The preferred embodiments of the present invention has been described, but it should be noted that the present invention is by no means intended to be limited to the above-described embodiments, but can be modified in various ways without departing from the scope and spirit of the invention.

Figure 9:
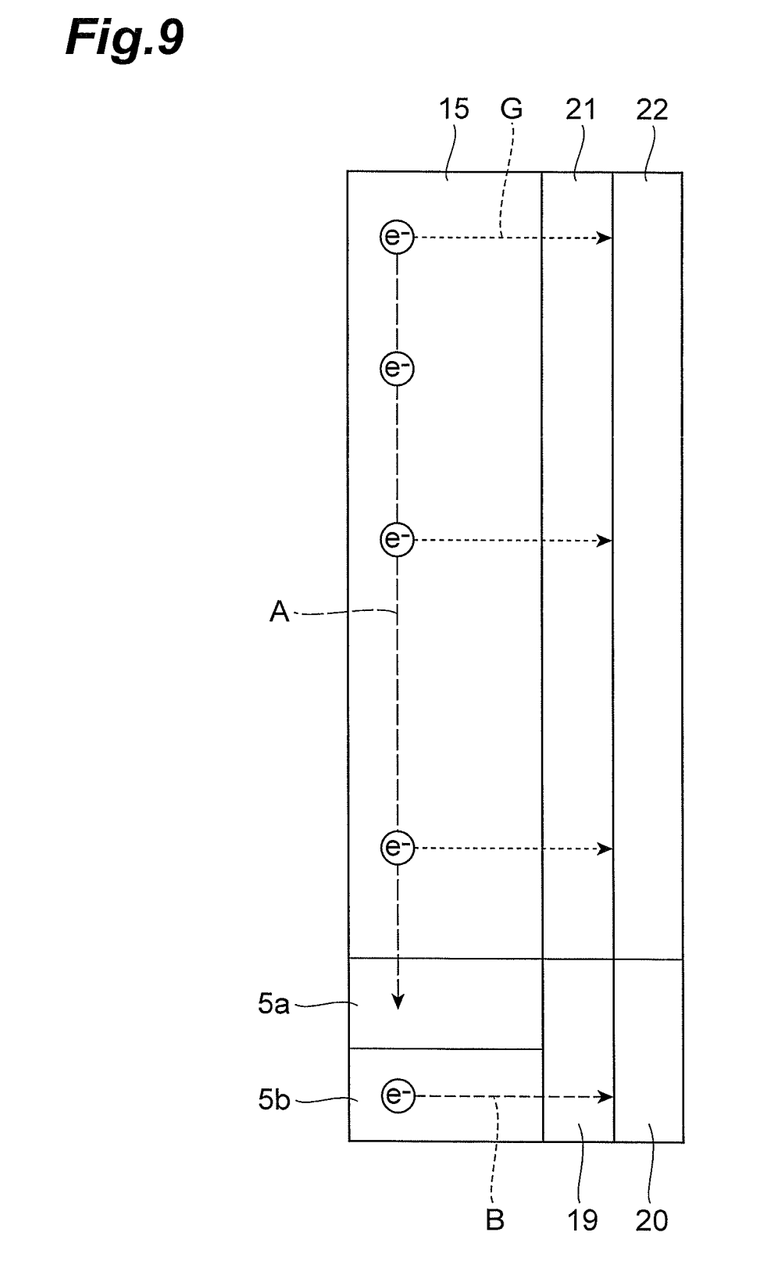
FIG. 9 is a schematic diagram showing a configuration of a modified example of the buffer gate portion.

For example, in the present embodiment, additionally, an all-reset gate (ARG) 21 and an all-reset drain (ARD) 22 may be juxtaposed. In this case, the all-reset gate 21 and the all-reset drain 22 are, as shown in FIG. 9, preferably juxtaposed respectively on the side of the other long side forming the planar shape of the photosensitive region 15. That is, it is preferable that the all-reset gate 21 is juxtaposed adjacent in the direction intersecting with the first direction to the photosensitive region 15, and the all-reset drain 22 is juxtaposed adjacent in the direction intersecting with the first direction to the all-reset gate 21.

In accordance with such a configuration, in the case where the charge in the photosensitive region 15 is reset, the charge generated in the photosensitive region 15 migrates in the direction of G in FIG. 9, thus the charge can reach the all-reset gate 21 and the all-reset drain 22 by a small migration distance (generally, about 10 to 24 μm, of a pixel pitch). Thereby, it is possible to shorten a time required for reset. It is possible to reset the charge in the photosensitive region 15 by use of the overflow gate 19 and the overflow drain 20. However, because the charge generated in the photosensitive region 15 has to migrate via the buffer gate portion 5 (A and B in FIG. 9), a time required for reset is long.

In the present embodiment, the buffer gate portion 5 is composed of the first buffer gate portion 5a and the second buffer gate portion 5b in two stages. However, the buffer gate portion 5 may be composed of three or more stages having different electric potentials. In the case where the buffer gate portion 5 is composed of three or more stages as well, it is recommended that the electric potentials increase in a step-like manner along the first direction. In this case as well, a potential difference increasing in a step-like manner toward the charge transfer direction (the above-described first direction) is generated in each buffer gate portion 5. Thus the charge is dominated by the potential difference (electric potential difference) to migrate, so as to speed up a charge transfer speed in the buffer gate portion 5.

The buffer gate portion 5 may be composed of a so-called resistive gate as the electric potential gradient forming region 17 of the photoelectric converting portion 3. In this configuration, the electrodes are given a constant electric potential difference at its two ends, to form an electric potential gradient according to an electric resistance component in the first direction of the electrode, i.e., an electric potential gradient increasing along the first direction. In this case, a potential difference increasing gradually toward the charge transfer direction (the above-described first direction) is generated in each buffer gate portion 5. Thus the charge is dominated by the potential difference (electric potential difference) to migrate, so as to speed up a charge transfer speed in the buffer gate portion 5.

INDUSTRIAL APPLICABILITY

The present invention is applicable to a light detecting means of a spectroscope.

REFERENCE SIGNS LIST

1 . . . solid-state imaging device; 3 . . . photoelectric converting portions; 5 . . . buffer gate portions; 7 . . . transfer portions; 9 . . . shift register; 15 . . . photosensitive regions; 17 . . . electric potential gradient forming regions; 23 . . . amplifier portion.

The invention claimed is:

1. A solid-state imaging device comprising:
a plurality of photoelectric converting portions, each having a photosensitive region which generates a charge according to incidence of light, and which has a planar shape of a nearly rectangular shape formed by two long sides and two short sides, and an electric potential gradient forming region which forms an electric potential gradient increasing along a predetermined direction parallel to the long sides forming the planar shape of the photosensitive region with respect to the photosensitive region, the plurality of photoelectric converting portions being juxtaposed along a direction intersecting with the predetermined direction;

a plurality of charge accumulating portions, each being arranged corresponding to the photoelectric converting portion and on the side of the other short side forming the planar shape of the photosensitive region, and each accumulating a charge generated in the photosensitive region of the corresponding photoelectric converting portion; and a charge output portion which acquires charges respectively transferred from the plurality of charge accumulating portions, and transfers the charges in the direction intersecting with the predetermined direction, to output the charges, wherein the charge accumulating portion has a first gate electrode and a second gate electrode that are arranged along the predetermined direction, and wherein a first predetermined electric potential is applied to the first gate electrode and a second predetermined electric potential different from the first predetermined electric potential is applied to the second gate electrode so as to increase potential toward the predetermined direction.

2. A solid-state imaging device comprising:

a plurality of photoelectric converting portions, each having a photosensitive region which generates a charge according to incidence of light, and which has a planar shape of a nearly rectangular shape formed by two long sides and two short sides, and an electric potential gradient forming region which forms an electric potential gradient increasing along a predetermined direction parallel to the long sides forming the planar shape of the photosensitive region with respect to the photosensitive region, the plurality of photoelectric converting portions being juxtaposed along a direction intersecting with the predetermined direction;

a plurality of charge accumulating portions, each being arranged corresponding to the photoelectric converting portion and on the side of the other short side forming the planar shape of the photosensitive region, and each accumulating a charge generated in the photosensitive region of the corresponding photoelectric converting portion; and a charge output portion which acquires charges respectively transferred from the plurality of charge accumulating portions, and transfers the charges in the direction intersecting with the predetermined direction, to output the charges, wherein the charge accumulating portion has a first gate electrode and a second gate electrode that are arranged along the predetermined direction, and a first predetermined electric potential is applied to the first gate electrode and a second predetermined electric potential different from the first predetermined electric potential is applied to the second gate electrode such that the potential is increasing in the predetermined direction.

* * * * *